United States Patent
Hairston

(10) Patent No.: US 10,447,293 B1
(45) Date of Patent: Oct. 15, 2019

(54) COUNT TIME MEASUREMENT ANALOG TO DIGITAL CONVERSION

(71) Applicant: BAE Systems Information and Electronic Systems Integration Inc., Nashua, NH (US)

(72) Inventor: Allen W Hairston, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/206,151

(22) Filed: Nov. 30, 2018

(51) Int. Cl.
  *H03M 1/50* (2006.01)
  *H04N 5/378* (2011.01)

(52) U.S. Cl.
  CPC .............. *H03M 1/50* (2013.01); *H04N 5/378* (2013.01)

(58) Field of Classification Search
  CPC .................................. H03M 1/50; H04N 5/378
  USPC ................................................... 341/155, 156
  See application file for complete search history.

(56) References Cited

U.S. PATENT DOCUMENTS

| | | | |
|---|---|---|---|
| 7,492,400 B2* | 2/2009 | El Gamal | H04N 5/2351 250/208.1 |
| 10,062,358 B2* | 8/2018 | Zheng | G09G 5/10 |

* cited by examiner

*Primary Examiner* — Khai M Nguyen
(74) *Attorney, Agent, or Firm* — Maine Cernota & Rardin

(57) ABSTRACT

A system and method is provided for analog to digital conversion, the system having: a front end whereby a current is converted to digital pulses; and a back end with a coarse conversion unit outputting a pulse count; and a fine conversion unit outputting a count time measurement count; wherein said back end unit is configured to combine said pulse count and said count time measurement to produce a high dynamic range output, said output being the product of the one more than the pulse count and the integration time divided by the sum of the integration time and the count time management count.

14 Claims, 2 Drawing Sheets

COUNT TIME MEASUREMENT ANALOG TO DIGITAL CONVERSION

STATEMENT OF GOVERNMENT INTEREST

Portions of the present invention may have been made in conjunction with Government funding under contract number FA8650-15-C-7538, subcontract 9505064, and there may be certain rights to the Government.

FIELD

The description relates to analog to digital conversion, and more particularly, to a system and method for conversion of an analog signal to a digital signal using count time measurement.

BACKGROUND

Digital detection of visual and infrared (IR) images is a very widely used technology, ranging from consumer-oriented camera and video apparatus to law enforcement and military applications. For virtually all of these applications, there is a growing demand for higher image pixel counts, higher pixel density, increased sensitivity, improved dynamic range, and faster image processing.

In particular, many emerging thermal infrared (IR) sensing applications simultaneously demand high sensitivity, large dynamic range, large pixel count, and operation at fast data rates. Among these applications are day/night persistent surveillance, border patrol and protection, aerial search and rescue, and environmental remote sensing. Such applications require sensor systems capable of high-quality, large-pixel-count images. Organizations such as the US Army Night Vision and Electronic Sensors Directorate (NVESD) are demanding ever higher pixel counts and densities to meet the challenges brought about by such applications.

At the heart of all digital imaging systems is the Focal Plane Array ("FPA"), which is a two-dimensional array of elements upon which an image is focused, whereby each of the FPA elements or "pixels" develops an analog output "signal charge" that is proportional to the intensity of the light that is impinging on it. Traditionally, a readout integrated circuit ("ROIC") uses an integration capacitor to store the signal charge at each pixel of the FPA, and then routes the analog signals onto output taps for readout and digitization by analog-to-digital converters ("ADC's") external to the individual pixels. This approach requires storing a large signal charge at each pixel site, and further requires that an adequate signal-to-noise ratio and dynamic range be maintained as the analog signals are read out and digitized. Accordingly, this traditional approach suffers from sensitivity and dynamic range limitations.

Digital pixel readout integrated circuits have had a problem with getting sufficiently high gain for some applications. Known systems for analog to digital conversion have relied exclusively on counting the number of pulses over a given time for analog to digital conversion. This does not provide the requisite gain for these applications.

What is needed, therefore, are techniques for increased gain in the analog to digital conversion.

SUMMARY

One embodiment provides a system for analog to digital conversion, the system having a front end whereby a current is converted to digital pulses; and a back end having a coarse conversion unit outputting a pulse count; and a fine conversion unit outputting a count time measurement count; This measurement count is, in one embodiment, Tfinebit= (NFinebit×External Clock Period) where Nfinebit is the count which is output and clock period is the time known by the system and wherein the back end unit is configured to combine the pulse count and the count time measurement to produce an output having increased dynamic range. In one embodiment, the increase is approximately 20 bits, but one skilled in the art would recognize that other embodiments would be within the scope, provided that an extra fine conversion operation increases the dynamic range beyond what the reset counter alone provides, the output being the product of one more than the pulse count and the integration time divided by the sum of the integration time and the count time measurement count.

Another embodiment provides such a system wherein the count time measurement count is a product of the count number by an external clock period.

A further embodiment provides such a system wherein the pulse count is a number of reset pulses over a fixed integration time.

Yet another embodiment provides such a system wherein the front end having a current source providing current to an integration capacitor, the integration capacitor outputting an integration voltage; and a comparator configured to compare the output of the integration capacitor to a threshold voltage and to generate a reset pulse resetting the integration capacitor when the integration voltage reaches the threshold voltage.

A yet further embodiment provides such a system further comprising a photodiode providing the current source.

Even another embodiment provides such a system wherein the coarse conversion unit comprises a clock whose frequency is proportional to input current to a pulse counter allowing the pulse counter to measure the number of pulses in the time.

An even further embodiment provides such a system wherein the fine conversion unit comprises a fine conversion switch, activating the fine conversion unit upon completion of the pulse count.

Still another embodiment provides such a system wherein the switch comprises a start-reset latch.

A still further embodiment provides such a system wherein the start-reset latch activates a counter which measures the time between the end of the coarse count and the reset of the integration capacitor.

Yet still another embodiment provides such a system wherein the system is a read out integrated circuit of a focal plane array.

One embodiment provides a method for analog to digital conversion, the method including receiving an analog voltage; integrating the analog voltage via an integration capacitor; outputting an integration voltage to a comparator; comparing the integration voltage to a threshold voltage with the comparator; resetting the integration capacitor when the integration voltage reaches the threshold voltage, thereby generating a digital pulse; counting the number of the pulses within a fixed time; measuring a time from the conclusion of the counting a number of pulses until a next resetting of the integration capacitor; combining results of the counting and the measuring according to $$\text{Combined count} = \frac{(\text{Pulse Count} + 1)(\text{Time}_{Integration})}{\text{Time}_{Integration} + \text{Time}_{Count\ time\ measurment}}.$$

Another embodiment provides such a method including producing a high dynamic range output for a focal plane array.

A further embodiment provides such a method including resetting the integration capacitor results in filling up an input well.

Still another embodiment provides a method further comprising counting a number of times the input well is filled and when integration, is completed, measuring the time to a next full input well.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
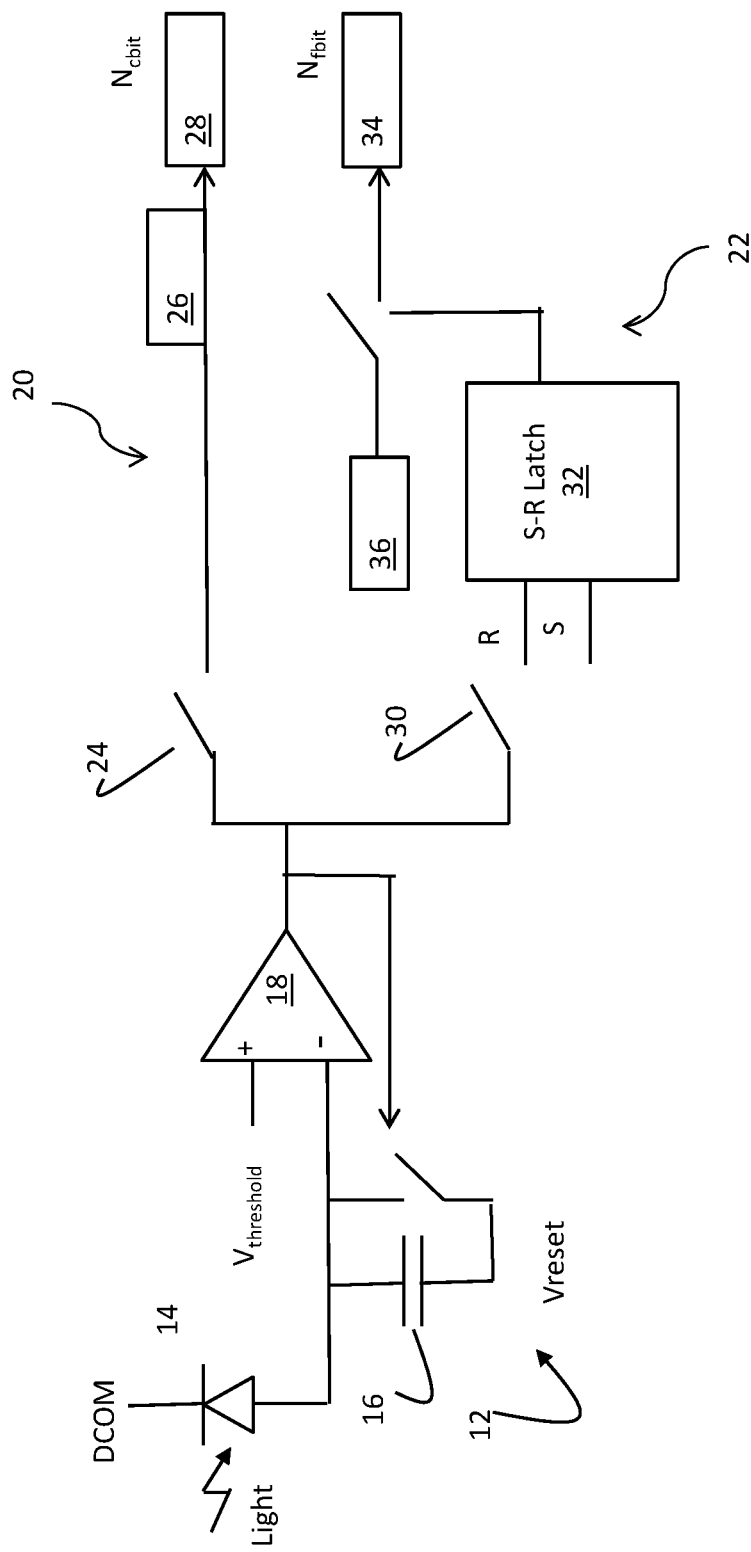
FIG. 1 is a block diagram illustrating an analog to digital conversion system configured in accordance with one embodiment.

As illustrated in FIG. 1, a read out integrated circuit (ROIC) is provided with a front end input circuit or current to frequency converter 12 integrating photocurrent from a detector, in one embodiment a photo diode 14 on an integration capacitor 16. When the integration voltage from the integration capacitor equals a voltage threshold ($V_{threshold}$) a comparator 18 triggers a reset pulse which resets the capacitor 16. The digital pulse resulting from this front end input circuit 12 is then subjected to a back end operation having both a coarse 20 and a fine 22 conversion. Coarse conversion 20 is conducted first, wherein a coarse switch 24 is activated and the reset pulses become an input/output clock (CK) 26 which provides input to an event counter 28, which counts the pulses resulting from the front end input circuit 12 for a fixed integration time ($T_{int}$). In one embodiment the input/output 26 is a series of pulses, each pulse representing a reset of the integration capacitor. The pulses of 26 are counted by event counter 28. The course switch 24 controls the mode of operation of the circuit, either coarse or fine. Input/output clock 26 may be have a frequency that is proportional to input current to a pulse counter allowing the pulse counter to measure the number of pulses in the time. In one embodiment, resetting an integration well that fills generates a digital signal whose pulse frequency is proportional to the input current. After this coarse conversion is conducted, fine conversion is conducted, using a count time measurement (CTM) conversion step. In such a setup, a fine conversion activation switch 30 initiates a count of an external reference clock 36. A set-reset (S-R) Latch is used to enable the external counting, starting at the end of coarse conversion and ending at the next reset pulse 32. This count is terminated when the comparator 18 fires indicating that the integration capacitor 16 has been filled and the circuit is reset. The fine bit time ($T_{finebit}$) is the product of the number counted by a CTM Counter 34 ($N_{Finebit}$) by an input based on an external clock 36. This count is expressed in the equation:

$$T_{finebit} = (N_{Finebit} \times \text{External Clock Period})$$

Coarse ($N_{coarsebit}$) and fine ($N_{finebit}$) counts are then combined according to the following formula to provide a high dynamic range output.

$$\text{Output} = (N_{coarsebit} + 1)(T_{int}/(T_{int} + T_{finebit}))$$

In some embodiments, this is a calculation done externally to the circuit. The external calculation uses the two values that are output by the circuit (Nfinebit and Ncoarsebit) to calculate one value for the signal for that pixel.

Figure 2:
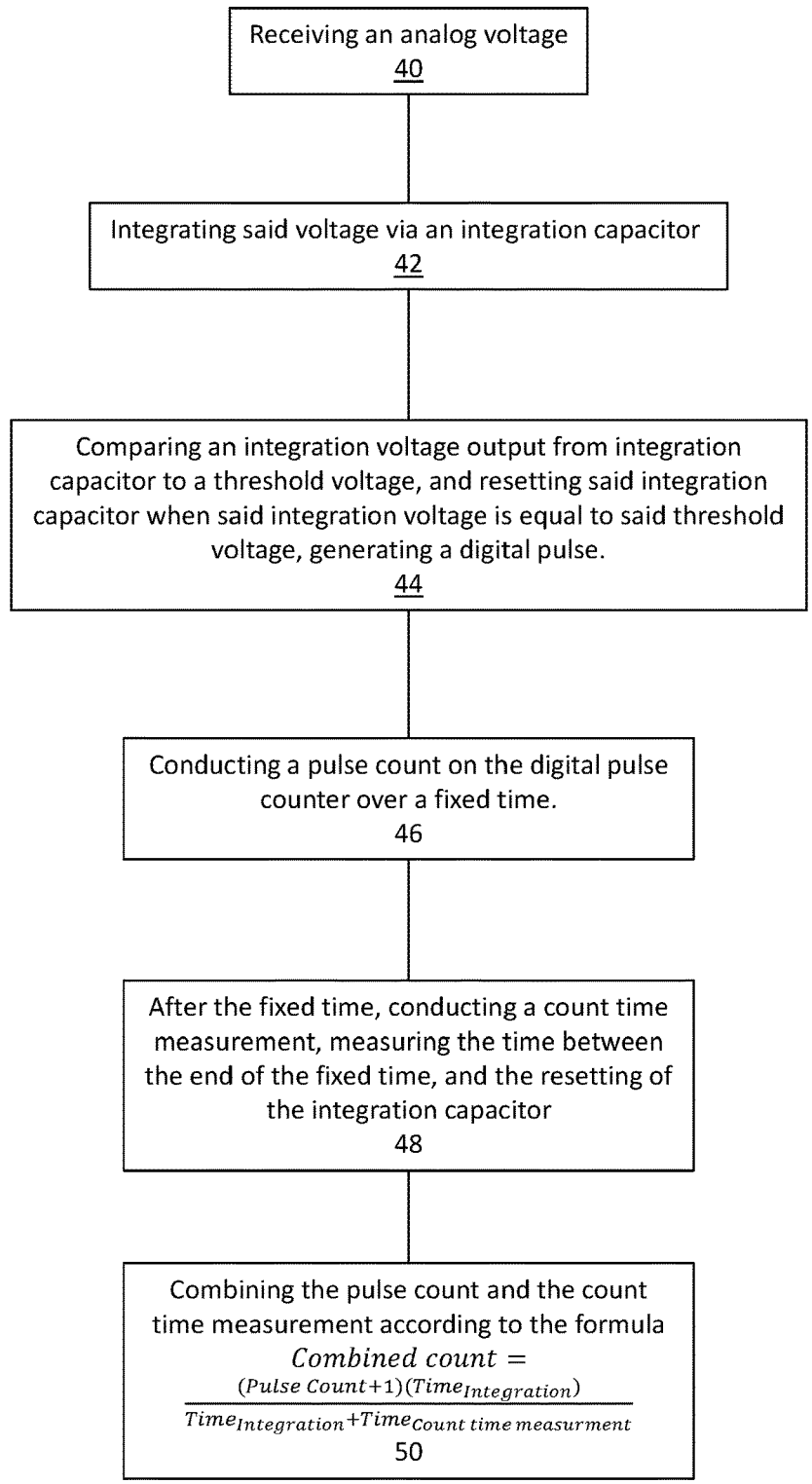
FIG. 2 is a flow chart illustrating a method for analog to digital conversion configured in accordance with one embodiment.

In such an embodiment, the process associated therewith being illustrated in FIG. 2 the digital pixel conversion starts receiving an analog voltage 40, integrating the voltage with an integration capacitor 42 comparing the voltage of the integration capacitor with that of a threshold voltage, and resetting the integration capacitor when the threshold is reached 44, i.e. filling up a well. The method then continues, first with counting the number of times that an input well fills up 46. At the end of integration, the ROIC of one embodiment, switches to measuring the time to the next full well 48. This allows a precise determination of the signal size by knowing the integration time to precisely fill up an integral number of wells. The output is thus two pieces of data, the number of well fills and the time to the last well fill. The system is then configured to combine according to $$\text{Combined count} = \frac{(\text{Pulse Count} + 1)(\text{Time}_{Integration})}{\text{Time}_{Integration} + \text{Time}_{Count\ time\ measurment}}$$

to get a more accurate signal 50.

One embodiment provides a method of analog to digital conversion that is designed for use in an application that integrates a current for a specified integration time. One such an application is an Infrared (IR) Focal Plane Array (FPA) Readout Integrated Circuit (ROIC), but those skilled in the art would recognize that other such applications would also be applicable. In such an embodiment a detector photocurrent is integrated for a specified amount of time (integration time) and converted to digital counts.

The analog to digital conversion according to such an embodiment is done in a series of steps: Current is converted to frequency (I to F) and the output of the I to F conversion is a series of digital pulses. These pulses are counted for a fixed integration time where the reset integration capacitor in current to frequency converter starts the fixed time and the conversion output is a count, a voltage on the integration capacitor allowing the capacitor to be reset when the pulse is.

The time until the next reset pulse occurs CTM is measured using another counter with an external reference clock. The outputs of these two counters can be combined to generate a high dynamic range output. For purposes of this disclosure, a high dynamic range is one that is an increase in dynamic range over that provided by pulse count systems. In such embodiments "higher gain" is higher resolution. Embodiments provide fractional pulse count, not merely integral counts with the increase in resolution depending on the accuracy of the time measurement.

In embodiments pulse counting and time to fill a well are combined. Such a combination may be embodied in an ROIC input circuit. More specifically, analog to digital conversion of an integrated current in a focal plane array (FPA) readout integrated circuit (ROIC) pixel.

One embodiment provides a system for analog to digital conversion, the system having a front end whereby a current is converted to digital pulses; and a back end having a coarse conversion unit outputting a pulse count; and a fine conversion unit outputting a count time measurement count; wherein the back end unit is configured to combine the pulse count and the count time measurement to produce an output having increased dynamic range, the output being the product of one more than the pulse count and the integration time divided by the sum of the integration time and the count time measurement count.

Another embodiment provides such a system wherein the count time measurement count is a product of the count number by an external clock period.

A further embodiment provides such a system wherein the pulse count is a number of reset pulses over a fixed integration time.

Yet another embodiment provides such a system wherein the front end having a current source providing current to an integration capacitor, the integration capacitor outputting an integration voltage; and a comparator configured to compare the output of the integration capacitor to a threshold voltage and to generate a reset pulse resetting the integration capacitor when the integration voltage reaches the threshold voltage.

A yet further embodiment provides such a system further comprising a photodiode providing the current source.

Even another embodiment provides such a system wherein the coarse conversion unit comprises a clock 26 whose frequency is proportional to input current to a pulse counter allowing the pulse counter to measure the number of pulses in the time.

An even further embodiment provides such a system wherein the fine conversion unit comprises a fine conversion switch, activating the fine conversion unit upon completion of the pulse count.

Still another embodiment provides such a system wherein the switch comprises a start-reset latch.

A still further embodiment provides such a system wherein the start-reset latch activates a counter which measures the time between the end of the coarse count and the reset of the integration capacitor.

Yet still another embodiment provides such a system wherein the system is a read out integrated circuit of a focal plane array.

One embodiment provides a method for analog to digital conversion, the method including receiving an analog voltage; integrating the analog voltage via an integration capacitor; outputting an integration voltage to a comparator; comparing the integration voltage to a threshold voltage with the comparator; resetting the integration capacitor when the integration voltage reaches the threshold voltage, thereby generating a digital pulse; counting the number of the pulses within a fixed time; measuring a time from the conclusion of the counting a number of the pulses until a next resetting of the integration capacitor; combining results of the counting and the measuring according to $$\text{Combined count} = \frac{(\text{Pulse Count} + 1)(\text{Time}_{Integration})}{\text{Time}_{Integration} + \text{Time}_{Count\ time\ measurment}}.$$

Another embodiment provides such a method including producing a high dynamic range output for a focal plane array.

A further embodiment provides such a method including resetting the integration capacitor results in filling up an input well.

Still another embodiment provides a method further comprising counting a number of times the input well is filled and when integration, is completed, measuring the time to a next full input well.

Alternative embodiments would be understood by one skilled in the art to be within the scope of the invention, for example, embodiments wherein the CTM counter measures the time from the reset pulse to the end of the CTM time instead the time from the beginning of the CTM time to the reset pulse.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for analog to digital conversion, the system comprising:
   a front end whereby a current is converted to digital pulses; and
   a back end comprising:
   a coarse conversion unit outputting a pulse count; and
   a fine conversion unit outputting a count time measurement count
   wherein said back end unit is configured to combine said pulse count and said count time measurement to produce an output having increased dynamic range, said output being the product of one more than the pulse count and the integration time divided by the sum of the integration time and the count time measurement count.

2. The system of claim 1, wherein the count time measurement count is a product of the count number by an external clock period.

3. The system of claim 1, wherein the pulse count is a number of reset pulses over a fixed integration time.

4. The system of claim 1, wherein said front end comprises:
   a current source providing current to an integration capacitor, said integration capacitor outputting an integration voltage; and
   a comparator configured to compare the output of the integration capacitor to a threshold voltage and to generate a reset pulse resetting the integration capacitor when said integration voltage reaches said threshold voltage.

5. The system of claim 4 further comprising a photodiode providing the current source.

6. The system of claim 1 wherein said coarse conversion unit comprises a clock whose frequency is proportional to input current to a pulse counter allowing said pulse counter to measure the number of pulses in said time.

7. The system of claim 1 wherein the fine conversion unit comprises a fine conversion switch, activating said fine conversion unit upon completion of the pulse count.

8. The system of claim 7 wherein said switch comprises a start-reset latch.

9. The system of claim 8 wherein said start-reset latch activates a counter which measures the time between the end of said coarse count and the reset of said integration capacitor.

10. The system of claim 1 wherein the system is a read out integrated circuit of a focal plane array.

11. A method for analog to digital conversion, said method comprising:

receiving an analog voltage;

integrating said analog voltage via an integration capacitor;

outputting an integration voltage to a comparator;

comparing said integration voltage to a threshold voltage with said comparator;

resetting said integration capacitor when said integration voltage reaches said threshold voltage, thereby generating a digital pulse;

counting the number of said pulses within a fixed time;

measuring a time from the conclusion of said counting a number of said pulses until a next resetting of said integration capacitor;

combining results of said counting and said measuring according to $$\text{Combined count} = \frac{(\text{Pulse Count} + 1)(\text{Time}_{Integration})}{\text{Time}_{Integration} + \text{Time}_{Count\ time\ measurment}}.$$

12. The method according to claim 11, wherein the combined count produces a high dynamic range output for a focal plane array.

13. The method according to claim 11, wherein resetting the integration capacitor results in filling up an input well.

14. The method according to claim 11, further comprising counting a number of times the input well is filled and when integration, is completed, measuring the time to a next full input well.

* * * * *